(12) United States Patent
Asano et al.

(10) Patent No.: US 6,285,695 B1
(45) Date of Patent: Sep. 4, 2001

(54) SEMICONDUCTOR LASER

(75) Inventors: Hideki Asano; Mitsugu Wada; Toshiaki Fukunaga, all of Kanagawa-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/246,946

(22) Filed: Feb. 9, 1999

(30) Foreign Application Priority Data

Feb. 10, 1998 (JP) .................................................. 10-028238
Mar. 31, 1998 (JP) .................................................. 10-085230

(51) Int. Cl.$^7$ ....................................................... H01S 5/00
(52) U.S. Cl. .............................................. 372/45; 372/46
(58) Field of Search ................................. 372/45, 46, 50, 372/44

(56) References Cited

PUBLICATIONS

Zhang et al, "Strain–Compensated InGaAs/GaAsP/GaIn-AsP/GaInP Quantum Well Lasers (lambda~0.98 um) Grown By Gas–source Molecular Beam Epitaxy", Appl. Phys. Lett., vol. 62, No. 14, pp.1644–1646, Apr. 1993.*
Japanese Abstract No. 09270558 dated Oct. 14, 1997.
Japanese Abstract No. 08056045 dated Feb. 27, 1996.
Toshiaki Fukunaga et al. Reliable operation of strain–compensated 1.06 μm InGaAs/InGaAsP/GaAs single quantum well lasers, Jul. 1996, vol. 69.
Japanese Abstract No. 09148682 dated Jun. 6, 1997.
"Reliable operation of strain–compensated 1.06 μm InGaAs/InGaAsP/GaAs single quantum well lasers", Toshiaki Fukunaga et al., Appl. Phys. Letters vol. 69 No. 2, (1996), pp. 248–250.

* cited by examiner

Primary Examiner—Quyen P. Leung
(74) Attorney, Agent, or Firm—Sughrue, Mion, Zinn Macpeak & Seas, PLLC

(57) ABSTRACT

A semiconductor laser includes a first clad layer having one of p-type conductivity and n-type conductivity, a first optical waveguide layer, a first barrier layer of $GaAs_{1-y2}P_{y2}$, a quantum-well active layer of $In_{x3}Ga_{1-x3}As_{1-y3}P_{y3}$, a second barrier layer of $GaAs_{1-y2}P_{y2}$, a second optical waveguide layer and a second clad layer having the of p-type conductivity and n-type conductivity formed in this order on a GaAs substrate. Each of the first and second clad layers is of a composition which matches with the GaAs substrate in lattice. Each of the first and second optical waveguide layers is of a InGaAsP composition which matches with the GaAs substrate in lattice. Each of the first and second barrier layers is 10 to 30 nm in thickness and is of a composition which has tensile strain relative to the GaAs substrate, the product of the tensile strain and the thickness of each of the first and second barrier layers being 5 to 20% nm. The quantum-well active layer is 6 to 10 nm in thickness and is of a composition which has compressive strain of not smaller than 1.0% relative to the GaAs substrate. The sum of the product of the tensile strain and the thickness of the first barrier layer and that of the second barrier layer is larger than the product of the compressive strain and the thickness of the quantum-well active layer.

3 Claims, 4 Drawing Sheets

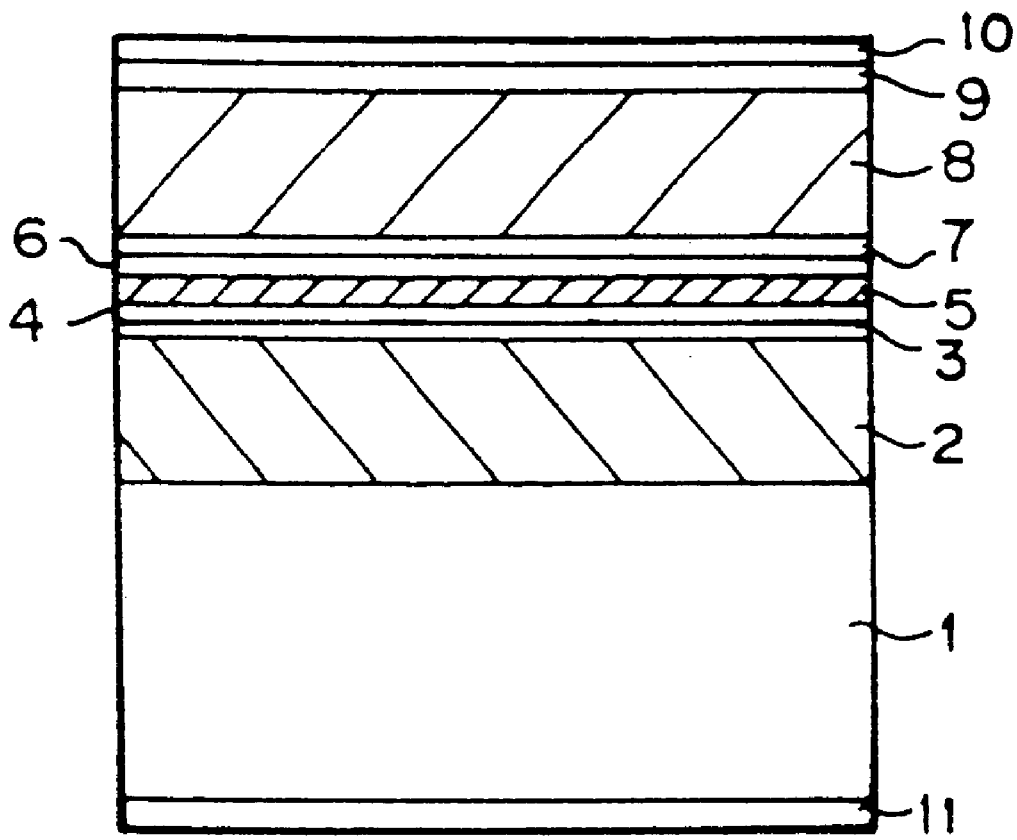
F I G . 1

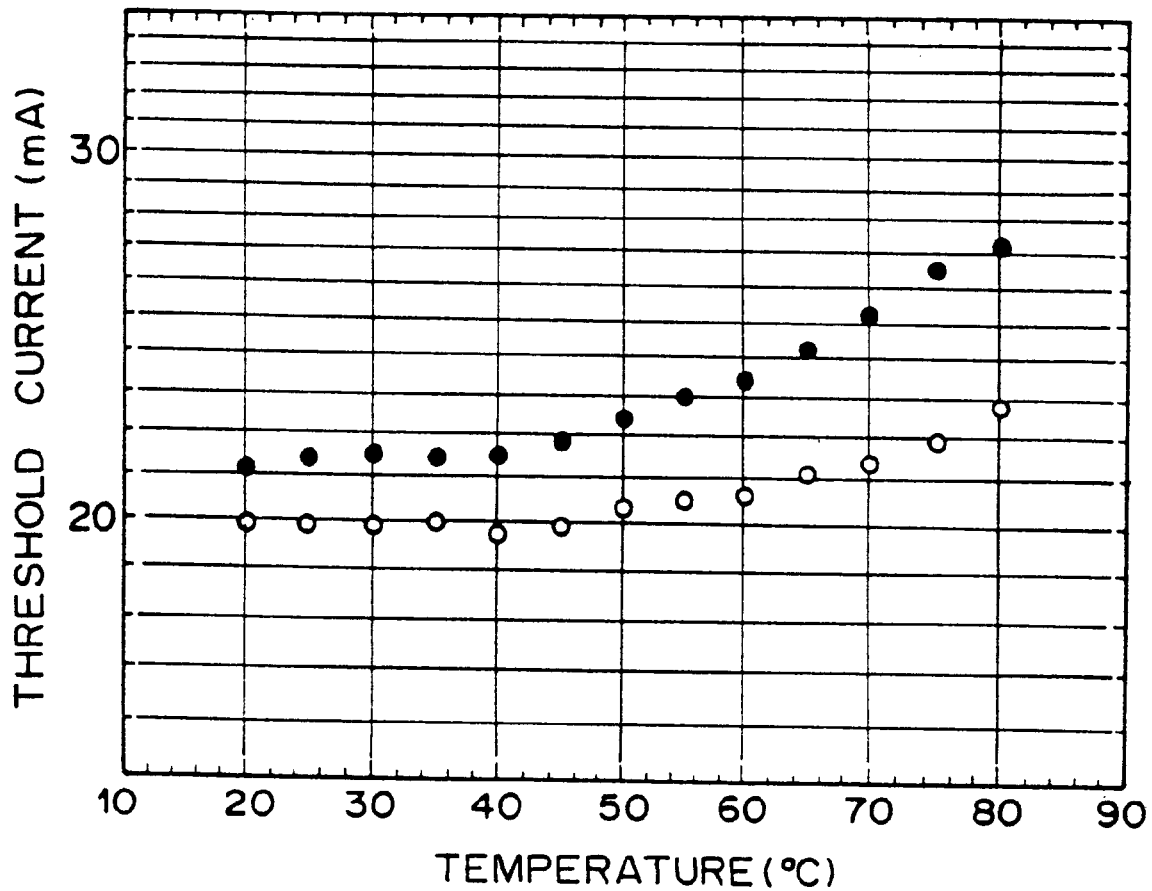
F I G. 3

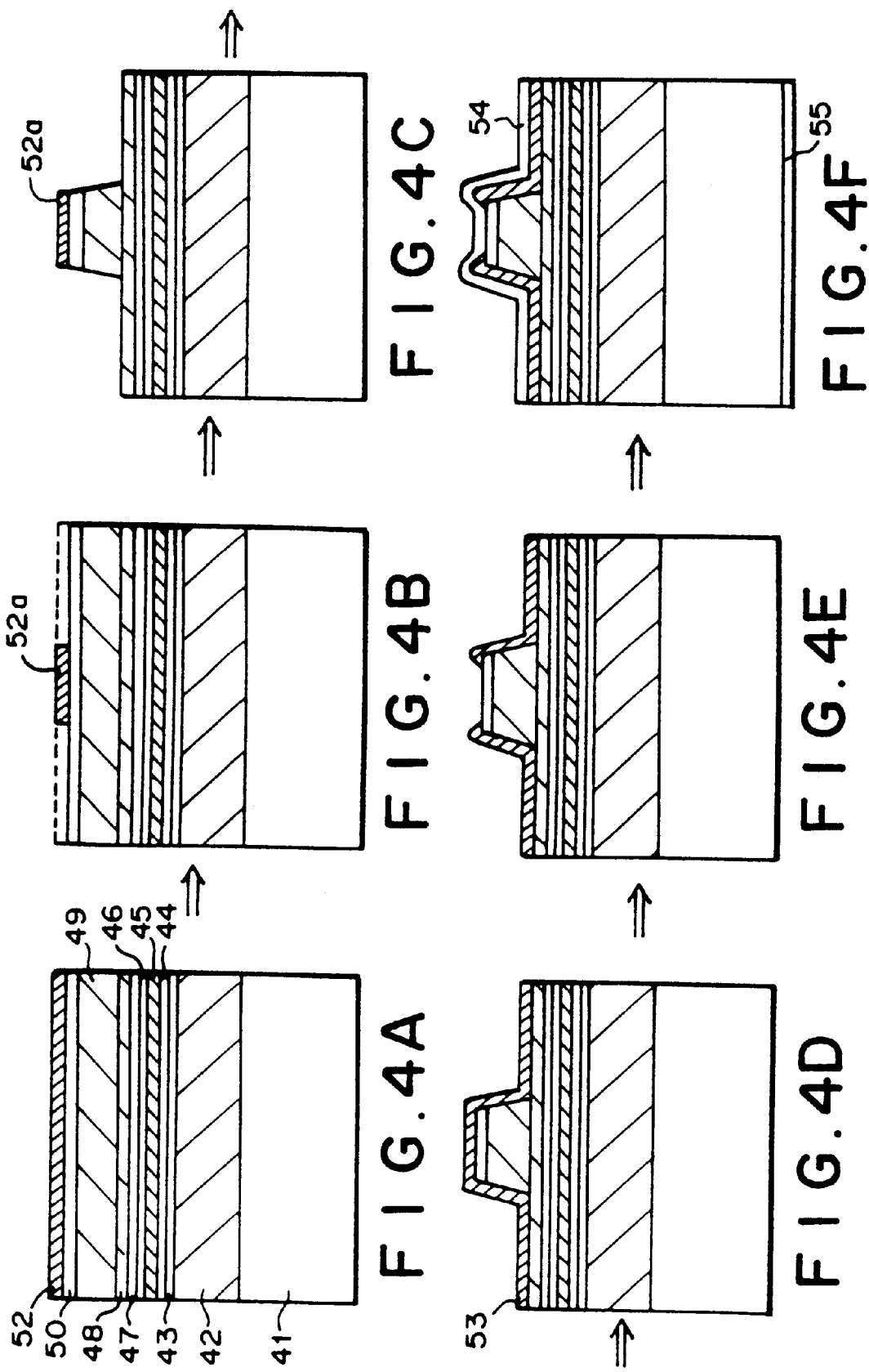

SEMICONDUCTOR LASER

BACKGROUND OF THE INVENTION

1. Field of the Invention

This invention relates to a semiconductor laser, and more particularly to compositions of semiconductor layers of a semiconductor laser.

2. Description of the Related Art

As-a-1060 nm-band semiconductor laser completely free from aluminum, there has been reported a semiconductor laser of a strain compensation structure comprising an n-InGaAsP clad layer, an undoped InGaAsP optical waveguide layer, an InGaAsP barrier layer which is 0.7% in tensile strain, an InGaAs quantum-well active layer which is 2.1% in compression strain, an InGaAsP barrier layer which is 0.7% in tensile strain, an undoped InGaAsP optical waveguide layer, a p-InGaAsP clad layer and a p-GaAs capping layer formed on an n-GaAs substrate in this order. See, for instance, "Applied Physics Letters, 99(1996)" pp248. However the Al-free semiconductor laser has reliability of only about 250 mW class and practically cannot be used as a higher output semiconductor laser.

Further as a 680 nm-band semiconductor laser whose active layer is free from aluminum, there has been reported a semiconductor laser in which a GaInP active layer is imparted with compressive strain, a side barrier layer is provided with an AlGaInP layer having tensile strain sufficient to cancel the compressive strain of the active layer, and the end face band gap is increased by relaxation in crystal structure in the vicinity of the radiating end face of the laser, thereby reducing absorption of light during oscillation and suppressing deterioration of the end faces due to absorption of light. However in order to use the tensile-strained side barrier layer in a 1000 nm-band semiconductor laser, an InGaAs active layer which is high in proportion of In must be used and the thickness of the active layer must be as small as the critical film thickness, which makes the crystal unstable. Further it is difficult to obtain a high quality crystal due to diffusion of In and accordingly it is difficult to obtain a semiconductor laser of high reliability.

SUMMARY OF THE INVENTION

In view of the foregoing observations and description, the primary object of the present invention is to provide a 1.0 μm-band semiconductor laser which is good in durability and is highly reliable even during oscillation at a high power.

In accordance with the present invention, there is provided a semiconductor laser comprising a first clad layer having one of p-type conductivity and n-type conductivity, a first optical waveguide layer, a first barrier layer of $GaAs_{1-y2}P_{y2}$, a quantum-well active layer of $In_{x3}Ga_{1-x3}As_{1-y3}P_{y3}$, a second barrier layer of $GaAs_{1-y2}P_{y2}$, a second optical waveguide layer and a second clad layer having the of p-type conductivity and n-type conductivity formed in this order on a GaAs substrate, wherein each of the first and second clad layers is of a composition which matches with the GaAs substrate in lattice, each of the first and second optical waveguide layers is of a InGaAsP composition which matches with the GaAs substrate in lattice, each of the first and second barrier layers is 10 to 30 nm in thickness and is of a composition which has tensile strain relative to the GaAs substrate, the product of the tensile strain and the thickness of each of the first and second barrier layers being 5 to 20% nm, the quantum-well active layer of $In_{x3}Ga_{1-x3}As_{1-y3}P_{y3}$ is 6 to 10 nm in thickness and is of a composition which has compressive strain of not smaller than 1.0% relative to the GaAs substrate, and the sum of the product of the tensile strain and the thickness of the first barrier layer and that of the second barrier layer is larger than the product of the compressive strain and the thickness of the quantum-well active layer.

It is preferred that the sum of the product of the tensile strain and the thickness of the first barrier layer and that of the second barrier layer be larger than the product of the compressive strain and the thickness of the quantum-well active layer at least by 3% nm.

Generally the first and second barrier layers are the same in composition, strain and thickness and accordingly the product of the tensile strain and the thickness of the first barrier layer is generally equal to that of the second barrier layer.

The tensile strain $\Delta_1$ of each of the first and second barrier layers relative to the GaAs substrate is expressed as follow.

$$\Delta_1 = (|a_{GaAs} - a_1|/a_{GaAs}) \times 100 (\%)$$

wherein $a_{GaAs}$ represents the lattice constant of the GaAs substrate and $a_1$ represents the lattice constant of the barrier layer.

Similarly the compressive strain $\Delta_2$ of the quantum well active layer relative to the GaAs substrate is expressed as follow.

$$\Delta_2 = (|a_{GaAs} - a_2|/a_{GaAs}) \times 100 (\%)$$

wherein $a_{GaAs}$ represents the lattice constant of the GaAs substrate and $a_2$ represents the lattice constant of the active layer.

In the semiconductor laser in accordance with the present invention, since the active layer contains no Al, durability is increased. Further by virtue of the GaAsP tensile-strained barrier layers, the band gap is increased by lattice relaxation in the vicinity of the active layer, whereby absorption of light at the radiating end face of the laser can be reduced. Further by virtue of the first and second barrier layers whose tensile strain compensate for a part of compressive strain of the active layer, which is close to the critical thickness, during crystal growth, an active layer of high quality can be obtained. Further by virtue of a GaAsP layer, diffusion of In during crystal growth can be suppressed, whereby a crystal of high quality can be obtained. Further by virtue of the GaAsP tensile-strained barrier layers, the height of the barrier between the active layer and the barrier layers is enlarged, whereby leakage of electrons and positive holes from the active layer to optical waveguide layers can be reduced, whereby the drive current can be reduced and generation of heat at the end faces of the laser can be reduced. Accordingly, a laser which is highly reliable even during oscillation at a high power can be provided.

BRIEF DESCRIPTION OF THE DRAWING

FIG. 1 is a schematic cross-sectional view of a semiconductor laser in accordance with a first embodiment of the present invention, FIG. 3 is a graph showing the temperature dependence of the solid state laser of the first embodiment in comparison with a control semiconductor laser, and FIGS. 4A to 4F are cross-sectional views showing a semiconductor laser and the manufacturing steps of the same.

DESCRIPTION OF THE PREFERRED EMBODIMENTS

Figure 2:
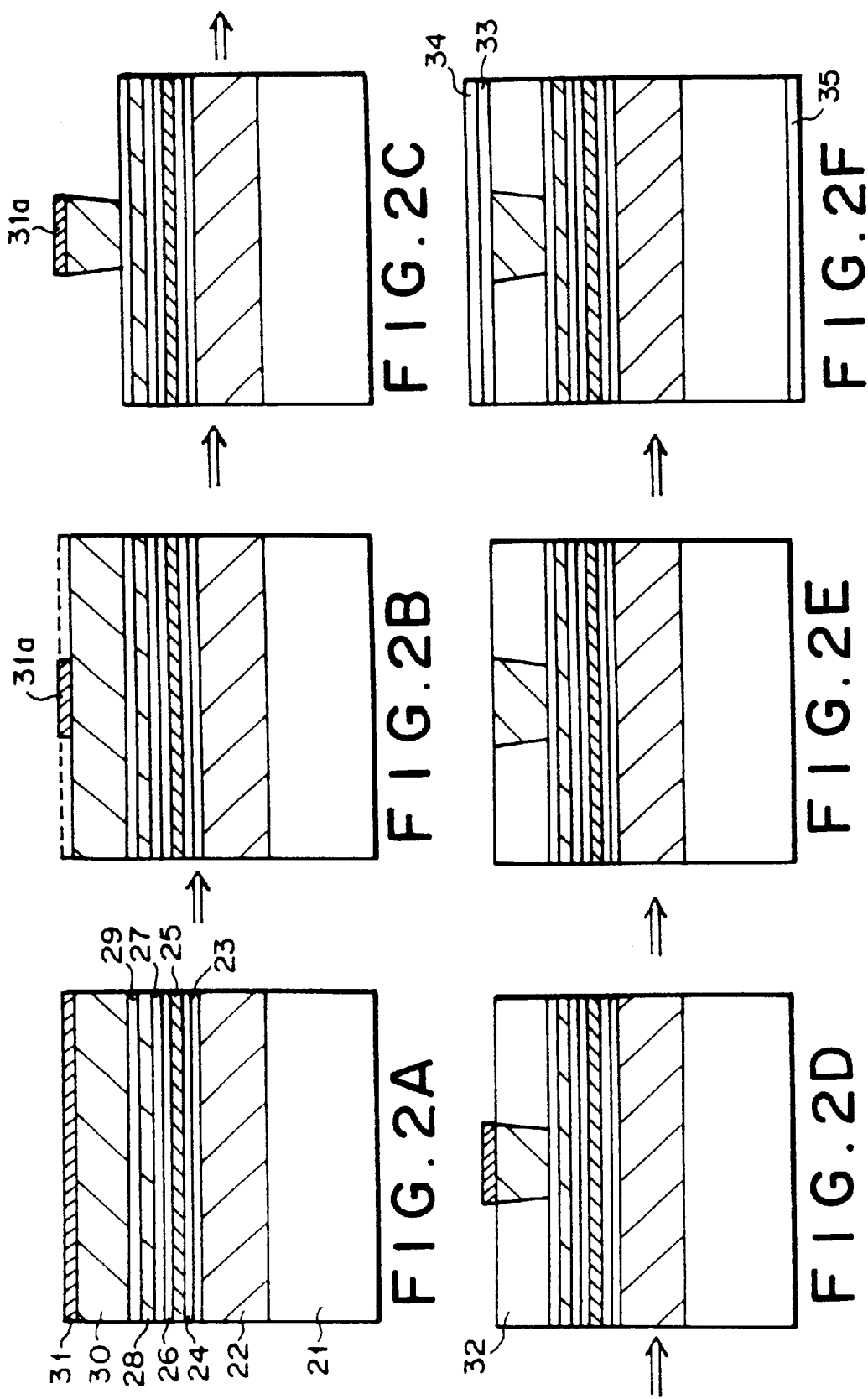
FIGS. 2A to 2F are cross-sectional views showing a semiconductor laser and the manufacturing steps of the same.

A semiconductor laser in accordance with a first embodiment of the present invention will be described referring to the manufacturing steps of the same.

An n-$In_{0.48}Ga_{0.52}P$ clad layer 2, an n- or i-$In_{x1}Ga_{1-x1}As_{1-y1}P_{y1}$ optical waveguide layer 3, an i-$GaAs_{1-y2}P_{y2}$ tensile-strained barrier layer 4, an $In_{x3}Ga_{1-x3}As_{1-y3}P_{y3}$ compressive-strained quantum-well active layer 5, an i-$GaAs_{1-y2}P_{y2}$ tensile-strained barrier layer 6, a p- or i-$In_{x1}Ga_{1-x1}As_{1-y1}P_{y1}$ optical waveguide layer 7, a p-$In_{0.48}Ga_{0.52}P$ clad layer 8 and a p-GaAs contact layer 9 are formed on an n-GaAs substrate 1 in this order by MOCVD.

Then a p-side electrode 10 is formed on the contact layer 9. Thereafter the substrate 1 is polished and an n-side electrode 11 is formed on the substrate 1. Thus the semiconductor laser of this embodiment is finished.

Each of the clad layers 2 and 8 and the optical waveguide layers 3 and 7 is of a composition which matches with the GaAs substrate 1 in lattice. The quantum-well active layer 5 is 6 nm in thickness and is of a composition which has compressive strain of $_{1.5}$% relative to the GaAs substrate 1. Each of the tensile-strained barrier layers 4 and 6 is 10 nm in thickness and is of a composition which has tensile strain of $_{0.7}$% relative to the GaAs substrate 1. The strain and the thickness of each of the layers need not be limited to those described above so long as the quantum-well active layer 5 is in the range of 6 to 10 nm in thickness and is of a composition which has compressive strain of preferably 1.0% to 3.0% inclusive, and more preferably 1.0% to 2.5% inclusive, relative to the GaAs substrate 1, each of the barrier layers 4 and 6 is in the range of 10 to 30 nm in thickness and is of a composition which has, relative to the GaAs substrate 1, tensile strain which gives a product of 5 to 20% nm when multiplied with the thickness, and the sum of the product of the tensile strain and the thickness of the barrier layer 4 and that of the barrier layer 6 is larger than the product of the compressive strain and the thickness of the quantum-well active layer 5, preferably, at least by 3% nm.

In the semiconductor laser in accordance with the present invention, since the active layer 5 contains no Al, durability is increased. Further by virtue of the GaAsP tensile-strained barrier layers 4 and 6, the band gap is increased by lattice relaxation in the vicinity of the active layer, whereby absorption of light at the radiating end face of the laser can be reduced. Further by virtue of the barrier layers 4 and 6 whose tensile strain compensate for a part of compressive strain of the active layer 5, which is close to the critical thickness, during crystal growth, the active layer 5 can be of high quality. Further by virtue of the GaAsP tensile-strained barrier layers 4 and 6, the height of the barrier between the active layer 5 and the barrier layers 4 and 6 is enlarged, whereby leakage of electrons and positive holes from the active layer 5 to the optical waveguide layers 3 and 7 can be reduced. As a result, the drive current can be reduced and generation of heat at the end faces of the laser can be reduced. Accordingly, a 1.0 μm-band laser which is highly reliable even during oscillation at a high power can be realized.

Though, the first embodiment described above, the substrate 1 is of a type having an n-type conductivity, the substrate 1 may be of a type having a p-type conductivity. In this case, a p-type semiconductor layer is first formed on the substrate 1.

Though, in the first embodiment, the present invention is applied to a semiconductor laser having electrodes formed over the entire surfaces thereof, the present invention may be also applied to a gain waveguide stripe laser provided on its contact layer with insulating film having a stripe-like current injection window. Further the layer arrangement of the first embodiment may be applied to a semiconductor laser with index optical waveguide, a semiconductor laser with diffraction grating, an optical integrated circuit and the like which are formed by the normal photolithography and/or dry etching.

A semiconductor laser in accordance with a second embodiment of the present invention will be described in conjunction with the manufacturing steps of the same with reference to FIGS. 2A to 2F.

An n-$In_{x4}Ga_{1-x4}As_{1-y4}P_{y4}$ clad layer 22, an n- or i-$In_{x1}Ga_{1-x1}As_{1-y1}P_{y1}$ optical waveguide layer 23, an i-$GaAs_{1-y2}P_{y2}$ tensile-strained barrier layer 24, an $In_{x3}Ga_{1-x}As$ compressive-strained quantum-well active layer 25, an i-$GaAs_{1-y2}P_{y2}$ tensile-strained barrier layer 26, a p- or i-$In_{x1}Ga_{1-x1}As_{1-y1}P_{y1}$ optical waveguide layer 27, a p-$In_{0.48}Ga_{0.52}P$ upper first clad layer 28, a p-GaAs etching stopping layer 29 and a p-$In_{0.48}Ga_{0.52}P$ upper second clad layer 30 are formed on an n-GaAs substrate 21 in this order by MOCVD. Then an insulating film 31 such as of $SiO_2$ is formed on the upper second clad layer 30. (FIG. 2A) Then the insulating film 31 is removed by ordinary lithography with a stripe-like portion 31a about 3 μm wide left there as shown in FIG. 2B. Thereafter using the stripe-like insulating film 31a as a mask, the epitaxial layers are removed by wet etching up to the upper surface of the p-GaAs etching stopping layer 29, thereby forming a ridge stripe as shown in FIG. 2C. At this time, when hydrochloric acid etching solution is employed, etching is automatically stopped at the p-GaAs etching stopping layer 29. The thickness of the p-$In_{0.48}Ga_{0.52}P$ upper first clad layer 28 should be such that index optical waveguiding in a fundamental transverse mode can be realized in the ridge stripe waveguide up to a high output power. An n-$In_{0.48}(Ga_{1-z5}Al_{z5})_{0.52}P$ current limiting layer 32 is formed on each side of the ridge stripe as shown in FIG. 2D. After the stripe-like insulating film 31a is removed (FIG. 2E), a p-GaAs contact layer 33 is caused to grow over the exposed p-$In_{0.48}Ga_{0.52}P$ upper second clad layer 30 and the n-$In_{0.48}(Ga_{1-z5}Al_{z5})_{0.52}P$ current blocking layer 32 and a p-side electrode 34 is formed on the p-GaAs contact layer 33. Then the substrate 21 is polished and an n-side electrode 35 is formed thereon. (FIG. 2F)

Thereafter resonator faces are formed by cleavage of the sample. High reflectivity coating is provided on one of the resonator faces and a low reflectivity coating is provided on the other resonator face. Then the sample is shaped into a tip, thereby obtaining a semiconductor laser element. With the structure described above, the semiconductor laser element thus obtained can generate a high output level laser beam while holding a fundamental transverse mode.

A semiconductor laser element of this embodiment where the sum of the product of the tensile strain and the thickness of the first barrier layer and that of the second barrier layer is larger than the product of the compressive strain and the thickness of the quantum-well active layer by 5% nm, that is, the strain of the active layer is compensated for by 5% nm toward the tensile strain side, and a comparative example where the strain of the active layer is completely compensated for were evaluated and the result is shown in FIG. 3. In FIG. 3, ○ shows the temperature dependence of the threshold current of the semiconductor laser element of this embodiment and ● shows that of the comparative example.

As can be seen from FIG. 3, the semiconductor laser element of this embodiment is smaller than the comparative example in the temperature dependence of the threshold current.

Generally, the temperature dependence $I_{th}$ of the threshold current is expressed by formula $$I_{th}(T)=I_0 e^{(T/T_0)}$$

wherein To represents the characteristic temperature. As the characteristic temperature is higher, the temperature dependence of the threshold current of the semiconductor laser element is smaller and the stability of the semiconductor laser element during oscillation at a high output power is higher. In the semiconductor laser element of this embodiment where the strain of the active layer is compensated for by 5% nm toward the tensile strain side, the characteristic temperature To is 1467K in the range of 20° C. to 50° C. and higher by about 973K than the semiconductor laser element example where the strain of the active layer is completely compensated for. Further also in a higher temperature range of 50° C. to 80° C., the characteristic temperature of the semiconductor laser element of the present invention is 261K and higher than the comparative example by about 107K.

Thus in the semiconductor laser element in accordance with the present invention, the temperature dependence of the threshold current is largely reduced as compared with the conventional semiconductor laser element where the strain of the active layer is completely compensated for. The semiconductor laser element in accordance with the present invention can be operated without use of a temperature controller in the temperature range described above and accordingly the drive system can be manufactured at very low cost.

A semiconductor laser in accordance with a third embodiment of the present invention will be described in conjunction with the manufacturing steps of the same with reference to FIGS. 4A to 4F.

An n-$In_{0.48}Ga_{0.52}P$ clad layer 42, an n- or i-$In_{x1}Ga_{1-x1}As_{1-y1}P_{y1}$ optical waveguide layer 43, an i-$GaAs_{1-y2}P_{y2}$ tensile-strained barrier layer 44, an $In_{x3}Ga_{1-x3}As_{1-y3}P_{y3}$ compressive-strained quantum-well active layer 45, an i-$GaAs_{1-y2}P_{y2}$ tensile-strained barrier layer 46, a p- or i-$In_{x1}Ga_{1-x1}As_{1-y1}P_{y1}$ optical waveguide layer 47, a p-$In_{x4}Ga_{1-x4}As_{1-y4}P_{y4}$ upper first clad layer 48, a p-$In_{0.48}Ga_{0.52}P$ upper second clad layer 49 and a p-GaAs contact layer 50 are formed on an n-GaAs substrate 41 in this order by MOCVD. Then an insulating film 52 such as of $SiO_2$ is formed on the contact layer 50. (FIG. 4A)

Then the insulating film 52 is removed by ordinary lithography with a stripe-like portion 52a about 3 μm wide left there as shown in FIG. 4B. Thereafter using the stripe-like insulating film 52a as a mask, the epitaxial layers are removed by wet etching up to the upper surface of the p-$In_{x4}Ga_{1-x4}As_{1-y4}P_{y4}$ upper first clad layer 48, thereby forming a ridge stripe as shown in FIG. 4C. At this time, when sulfuric acid and hydrogen peroxide are used as the etching solution for removing the p-GaAs contact layer 50 and hydrochloric acid is employed as the etching solution for removing the p-$In_{0.48}Ga_{0.52}P$ upper second clad layer 49, etching is automatically stopped at the p-$In_{x4}Ga_{1-x4}As_{1-y4}P_{y4}$ upper first clad layer 48. The thickness of the p-$In_{x4}Ga_{1-x4}As_{1-y4}P_{y4}$ upper first clad layer 48 should be such that index optical waveguiding in a fundamental transverse mode can be realized in the ridge stripe waveguide up to a high output power. Then insulating film 53 is formed over the top surface and left and right side surfaces of the ridge stripe and the exposed upper surface of the upper first clad layer 48 as shown in FIG. 4D.

Thereafter the insulating film 53 over the upper surface of the ridge stripe is removed by ordinary lithography as shown in FIG. 4E. A p-side electrode 54 is formed over the exposed contact layer 50, the substrate 41 is polished and an n-side electrode 55 is formed thereon. (FIG. 4F)

Thereafter resonator faces are formed by cleavage of the sample. High reflectivity coating is provided on one of the resonator faces and a low reflectivity coating is provided on the other resonator face. Then the sample is shaped into a tip, thereby obtaining a semiconductor laser element. With the structure described above, the semiconductor laser element thus obtained can generate a high output level laser beam while holding a fundamental transverse mode.

It is possible to form an index optical waveguide laser of an embedded structure by repeating a crystal growth step three times using the same etching stopping mechanism as those described above.

Further by controlling the composition and the like of the $In_{x3}Ga_{1-x3}As_{1-y3}P_{y3}$ active layer, the oscillation wavelength can be controlled in the range of $$950 \text{ nm} < \lambda < 1100 \text{ nm}.$$

Further crystal growth may be effected also by a molecular beam epitaxial growth method using solid or gaseous raw materials.

The semiconductor laser in accordance with the present invention can be used as light sources in a high speed information/image processing, communication, measurement, medicine, printing and the like.

What is claimed is:

1. A semiconductor laser comprising:
   a first clad layer having one of p-type conductivity and n-type conductivity,
   a first optical waveguide layer,
   a first barrier layer of $GaAs_{1-y2}P_{y2}(0 \leq y2 \leq 1)$,
   a quantum-well active layer of $In_{x3}Ga_{1-x3}As_{1-y3}P_{y3}(0 \leq x3 \leq 1, 0 \leq y3 \leq 1)$,
   a second barrier layer of $GaAs_{1-y2}P_{y2}(0 \leq y2 \leq 1)$,
   a second optical waveguide layer, and
   a second clad layer having the of p-type conductivity and n-type conductivity formed in this order on a GaAs substrate,
   wherein each of the first and second clad layers is of a composition which matches with the GaAs substrate in lattice,
   wherein each of the first and second optical waveguide layers is of a InGaAsP composition which matches with the GaAs substrate in lattice, p1 wherein each of the first and second barrier layers is 10 to 30 nm in thickness and is of a composition which has tensile strain to the GaAs substrate,
   wherein the product of the tensile strain and the thickness of each of the first and second barrier layers being 5 to 20% nm,
   wherein the quantum-well active layer of $In_{1-x3}Ga_{1-x3}As_{1-y3}P_{y3}$ is 6 to 10 nm in thickness and is of composition which has compressive strain of not smaller than 1.0% relative to the GaAs substrate can realize oscillation at 950 to 1100 nm, and
   wherein a sum of a product of the tensile strain and the thickness of the first barrier layer and that of the second barrier layer is larger than a product of the compressive strain and the thickness of the quantum-well active layer.

2. A semiconductor laser as defined in claim 1 in which the sum of the product of the tensile strain and the thickness of the first barrier layer and that of the second barrier layer is larger than the product of the compressive strain and the thickness of the quantum-well active layer at least by 3% nm.

3. A semiconductor laser comprising a plurality of layers formed in the following order on an n-type or p-type GaAs substrate, the layers comprising:

- an $In_{0.48}Ga_{0.52}P$ first clad layer,
- an $In_{x1}Ga_{x1-x}As_{1-y1}P_{y1}$ first optical waveguide layer,
- a $GaAs_{1-y2}P_{y2}$ ($0 \leq y2 \leq 1$) first barrier layer,
- an $In_{x3}Ga_{1-x3}As_{1-x3}P_{y3}$ ($0 \leq x3 \leq 1$, $0 \leq y3 \leq 1$) quantum-well active layer,
- a $GaAs_{1-y2}P_{y2}$ ($0 \leq y2 \leq 1$) second barrier layer,
- an $In_{x1}Ga_{x1-x1}As_{1-y1}P_{y1}$ second optical waveguide layer, and
- an $In_{0.48}Ga_{0.52}P$ second clad layer, wherein each of the first and second clad layers is of a composition which matches with the GaAs substrate in lattice, wherein each of the first and second optical waveguide layers matches with the GaAs substrate in lattice, wherein each of the first and second barrier layers is 10 to 30 nm in thickness and is of a composition which has tensile strain relative to the GaAs substrate, wherein the product of the tensile strain and the thickness of each of the first and second barrier layers being 5 to 20% nm, wherein the quantum-well active layer of $In_{x3}Ga_{1-x3}As_{1-y3}P_{y3}$ is 6 to 10 nm in thickness and is of a composition which has compressive strain of not smaller than 1.0% relative to the GaAs substrate can realize oscillation at 950 to 1100 nm, and wherein a sum of a product of the tensile strain and the thickness of the first barrier layer and that of the second barrier layer is larger than a product of the compressive strain and the thickness of the quantum-well active layer.

* * * * *